United States Patent
Koyama et al.

(10) Patent No.: US 8,227,741 B2
(45) Date of Patent: Jul. 24, 2012

(54) PHOTOELECTRIC CONVERSION DEVICE AND ELECTRONIC DEVICE INCLUDING THE SAME

(75) Inventors: Jun Koyama, Kanagawa (JP); Hideaki Shishido, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 437 days.

(21) Appl. No.: 12/614,537

(22) Filed: Nov. 9, 2009

(65) Prior Publication Data

US 2010/0116972 A1 May 13, 2010

(30) Foreign Application Priority Data

Nov. 12, 2008 (JP) ................................. 2008-289408

(51) Int. Cl.
*H01L 31/00* (2006.01)
(52) U.S. Cl. .......... 250/214.1; 250/214 R; 250/214 DC; 250/214 C
(58) Field of Classification Search ............... 250/208.1, 250/208.2, 214.1, 214 R, 214 DC, 214 C; 257/431, 432, 435; 348/294, 302, 296; 327/512–515, 432
See application file for complete search history.

(56) References Cited

U.S. PATENT DOCUMENTS

| | | | | |
|---|---|---|---|---|
| 4,659,930 A | * | 4/1987 | Johnson et al. | 250/336.1 |
| 5,410,145 A | * | 4/1995 | Coroy | 250/214 C |
| 6,921,891 B2 | * | 7/2005 | Seitz | 250/214 R |
| 7,671,320 B2 | * | 3/2010 | Hirose et al. | 250/214.1 |

FOREIGN PATENT DOCUMENTS

JP 2003-046113 2/2003

* cited by examiner

*Primary Examiner* — Frances M Legasse, Jr.
(74) *Attorney, Agent, or Firm* — Nixon Peabody, LLP; Jeffrey L. Costellia

(57) ABSTRACT

An object is to provide a photoelectric conversion device which can correct a difference between a measured light intensity and an actual light intensity, which occurs when output current decreases due to the fact that a strong light is received, and outputs the corrected current. The photoelectric conversion device includes a photoelectric conversion element; a photocurrent output circuit for providing a first current corresponding to the amount of incident light on the photoelectric conversion element; a photocurrent correcting circuit which includes a corrective photoelectric conversion element for providing a second current, the corrective photoelectric conversion element including a light shield film for blocking part of light; a photocurrent adder circuit which includes a circuit for providing a fourth current; and an amplifier circuit including a circuit which amplifies a current corresponding to the sum of the first current and the fourth current and outputs the amplified current.

17 Claims, 12 Drawing Sheets

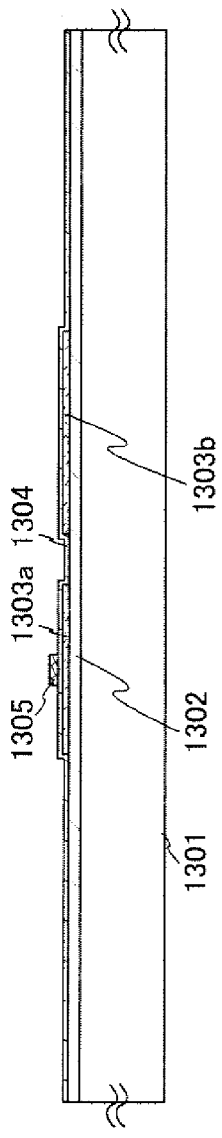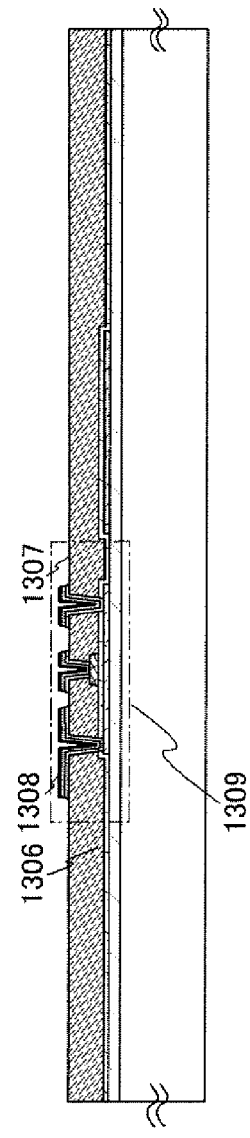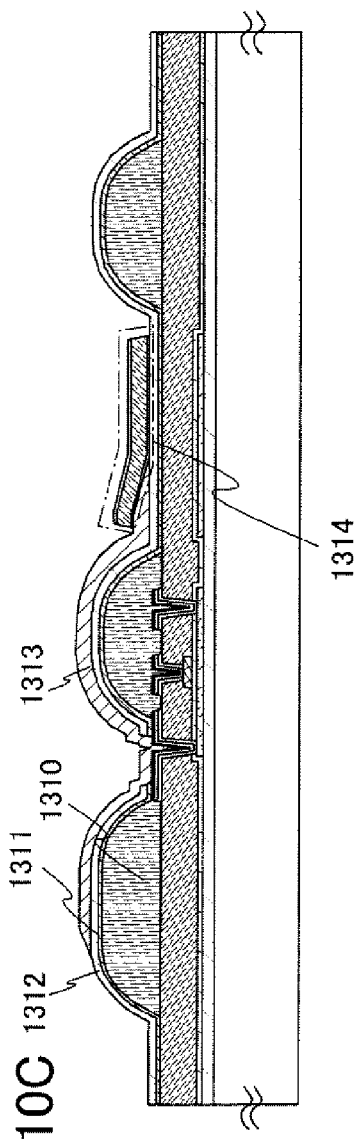

PHOTOELECTRIC CONVERSION DEVICE AND ELECTRONIC DEVICE INCLUDING THE SAME

BACKGROUND OF THE INVENTION

1. Field of the Invention

The present invention relates to a photoelectric conversion device and to an electronic device including the photoelectric conversion device. The present invention particularly relates to a photoelectric conversion device which can correct a signal output from the photoelectric conversion device in accordance with external environment and output the corrected signal, and to an electronic device including the photoelectric conversion device.

2. Description of the Related Art

A number of photoelectric conversion devices for detecting light are known; for example, a visible light sensor is commercially practical. A photoelectric conversion device is commonly used for devices which need illuminance adjustment, on/off control, or the like depending on the human living environment.

Some display devices detect its ambient brightness and adjust the display luminance. This is because the visibility can be improved and unnecessary electric power of the display device can be reduced by a photoelectric conversion device which detects ambient illuminance to obtain appropriate display luminance. For example, a mobile phone and a computer having a display portion are given as a display device which includes a photoelectric conversion device for adjusting luminance.

A photoelectric conversion device uses a photoelectric conversion element such as a photodiode for a light sensing portion and detects illuminance based on the amount of current (output current) which flows through the photoelectric conversion element. The photoelectric conversion device commonly includes a correcting circuit for correcting output current, dark current, etc. In Patent Document 1, a structure is described which is designed to detect an output current flowing from a photodiode and which employs a means for limiting a current which flows to the photodiode when a current which flows through the photodiode is greater than a predetermined value.

REFERENCE

[Patent Document 1] Japanese Published Patent Application No. 2003-46113

SUMMARY OF THE INVENTION

A photoelectric conversion device has a photoelectric conversion element such as photodiode, which converts light into electricity and outputs the electricity, in a light sensing portion. As for the photoelectric conversion element, output current corresponding to illuminance is output at a fixed value at a low illuminance of about 1 to 10000 lux, while the output current supposed to be proportional to an actual illuminance decreases with a strong light (also referred to as high-intensity light or harsh light) of about 10001 to 100000 lux. FIG. 3 illustrates a relationship between the illuminance and the output current in the photoelectric conversion device. The magnitude of the output current is proportional to the illuminance when the illuminance is low, that is, the illuminance is lower than the threshold illuminance $L_{th}$, while the output current decreases as strong light is incident when the illuminance is high, that is, the illuminance is higher than the threshold illuminance $L_{th}$ (see a dotted curve line 301 in FIG. 3). Therefore, when measuring the illuminance corresponding to the output current, in the case where the output current is obtained by the fact that light whose illuminance is higher than the threshold illuminance $L_{th}$ is received, a problem of a difference between the measured illuminance and the actual illuminance becomes obvious.

In view of the foregoing problem, an object of the present invention is to provide a photoelectric conversion device which can correct a difference between a measured light intensity and an actual light intensity, which occurs when output current decreases due to the fact that strong light is received, and output the corrected current.

One embodiment of the present invention is a photoelectric conversion device which includes a photoelectric conversion element; a photocurrent output circuit for providing a first current corresponding to the amount of incident light on the photoelectric conversion element; a photocurrent correcting circuit including a corrective photoelectric conversion element shielded from light by a light shield film which has transmittance expressed as a (0<a<1), and a circuit for providing a second current which is 1/a of a photocurrent corresponding to the amount of incident light on the corrective photoelectric conversion element; a photocurrent adder circuit which includes a circuit for providing a fourth current which is 1/(1−a) of a third current corresponding to a difference between the second current and the first current; and an amplifier circuit including a circuit which amplifies a current corresponding to the sum of the first current and the fourth current and outputs the amplified current.

One embodiment of the present invention provides a photoelectric conversion device which can correct a difference between a measured light intensity and an actual light intensity, which occurs when output current decreases due to the fact that strong light is received, and output the corrected current. Further, in one embodiment of the present invention, correction is not performed when the illuminance is low, so that an output current corresponding to the illuminance can be obtained without degradation in dynamic.

BRIEF DESCRIPTION OF THE DRAWINGS

In the accompanying drawings:
FIGS. 10A to 10C each illustrate Embodiment 2.

DETAILED DESCRIPTION OF THE INVENTION

Figure 1:
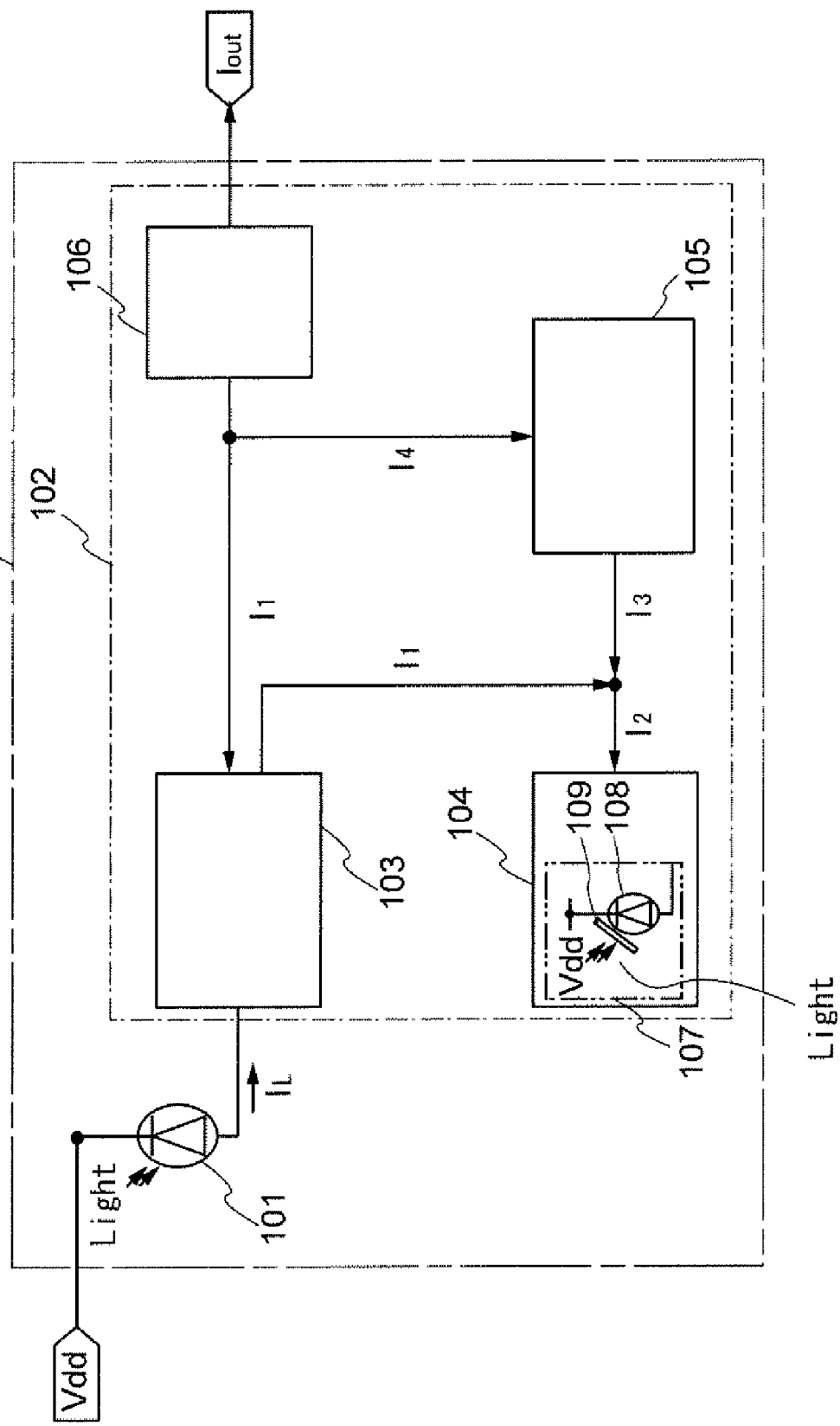
FIG. 1 illustrates Embodiment 1.

Hereinafter, embodiments of the present invention will be described with reference to the accompanying drawings. Note that the present invention can be implemented in many different modes, and it is to be easily understood by those skilled in the art that modes and details of the present invention can be variously changed without departing from the spirit and the scope of the present invention. Therefore, the present invention is not construed as being limited to the description of the following embodiments. Note that in the drawings for illustrating the embodiments, the same portions or portions having similar functions are denoted by the same reference numerals, and the description is not repeated.

Embodiment 1

In this embodiment, a structure and an operation of the photoelectric conversion device are described. Note that in this embodiment, a photoelectric conversion device is described which includes a photoelectric conversion element and a strong-light degradation correcting circuit which corrects a signal which is related to the amount of incident light (illuminance) obtained by the photoelectric conversion element and outputs the corrected signal.

First, a block diagram of the photoelectric conversion device is described. A photoelectric conversion device 100 illustrated in FIG. 1 includes a photoelectric conversion element 101 and a strong light degradation correcting circuit 102. The strong light degradation correcting circuit 102 includes a photocurrent output circuit 103, a photocurrent correcting circuit 104, a photocurrent adder circuit 105, and an amplifier circuit 106. The photocurrent output circuit 103 provides a first current corresponding to the amount of incident light on the photoelectric conversion element 101. The photocurrent correcting circuit 104 includes a corrective photoelectric conversion element 107 having a photoelectric conversion element 108 shielded from light by a light shield film 109 and provides a second current $I_2$ corresponding to incident light on the corrective photoelectric conversion element 107. The photocurrent adder circuit 105 provides a fourth current $I_4$ estimated with a third current $I_3$ corresponding to a difference between the first current $I_1$ and the second current $I_2$. The amplifier circuit 106 outputs a photocurrent $I_{out}$, which is obtained by amplifying and correcting the sum of the first current $I_1$ and the fourth current $I_4$, to the outside of the device.

Note that terms such as first, second, third to N-th (N is a natural number) seen in this specification are used in order to avoid confusion between components and do not set a limitation on number.

Note that although not illustrated in FIG. 1, the photoelectric conversion device is electrically connected to terminals or wirings for providing a high power supply potential Vdd and a low power supply potential Vss and outputs the corrected photocurrent $I_{out}$. Note also that in order to obtain an output of the photoelectric conversion device in voltage value, an external resistor is provided to obtain a voltage $V_{out}$.

Note that in this specification, the phrase "A is connected to B" means the case where A is electrically connected to B as well as the case where A is directly connected to B. Here, the phrase "A is electrically connected to B" means the case where, when an object having an electric function is placed between A and B, A and B are in the same or substantially the same node through the object.

Specifically, the case where it is acceptable that A and B are in the same node when considering the circuit operation is given. For example, the case where A and B are connected to each other through a switching element such as a transistor and are made to have the same or substantially the same potential by the fact that the switching element is conducting, or the case where A and B are connected to each other through a resistor, and the potential difference generated across the resistor does not adversely affect the operation of a circuit which includes A and B is given.

Note that a PIN photodiode may be used as the photoelectric conversion element 101 and as the photoelectric conversion element 108 which is shielded from light. Instead of a PIN photodiode, a PN photodiode may be used as the photoelectric conversion element 101 and as the photoelectric conversion element 108 which is shielded from light. A PIN photodiode is preferable because greater response characteristics to incident light can be obtained in the depletion layer as compared to a PN photodiode.

Figure 2:
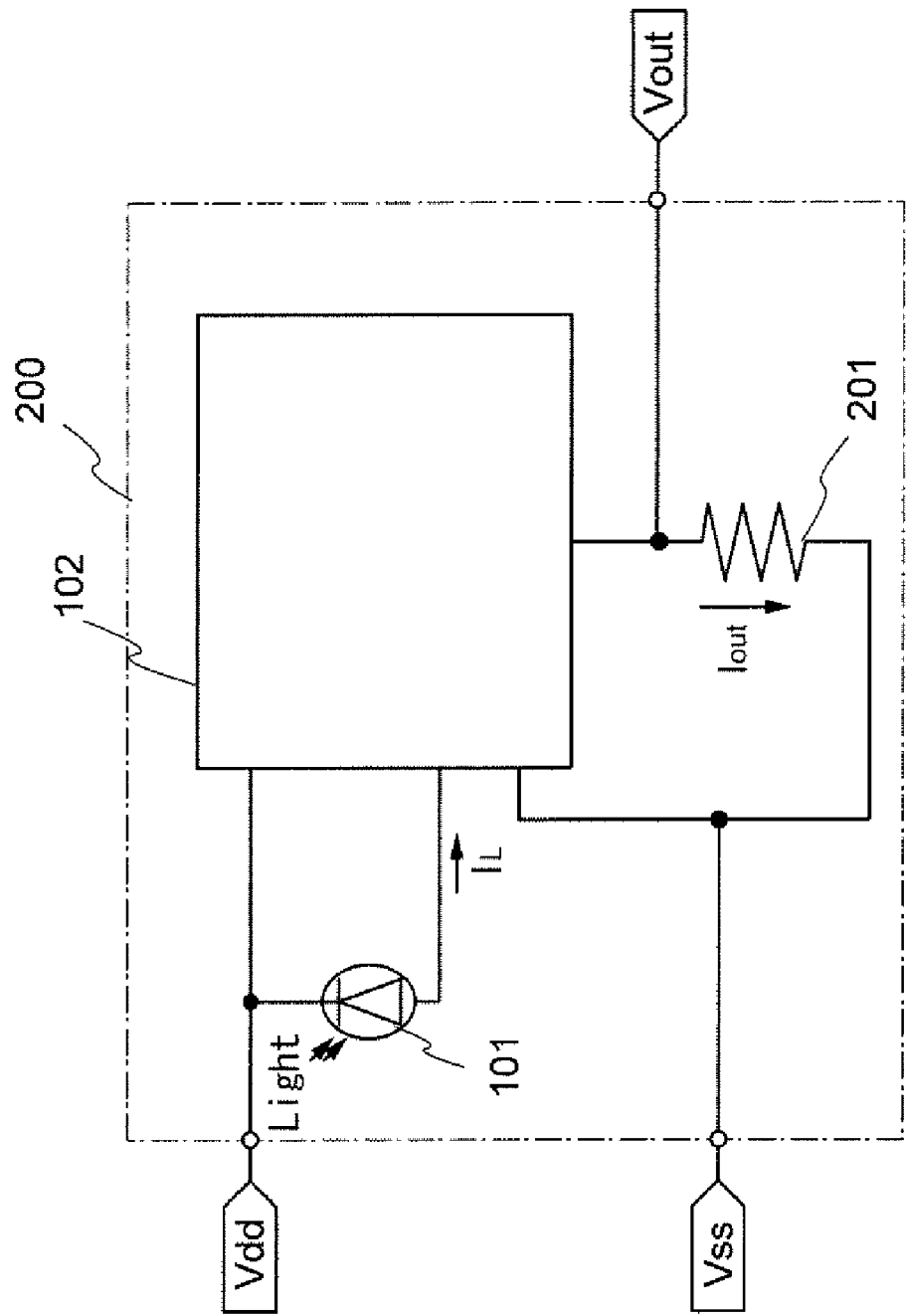
FIG. 2 illustrates Embodiment 1.
Figure 3:
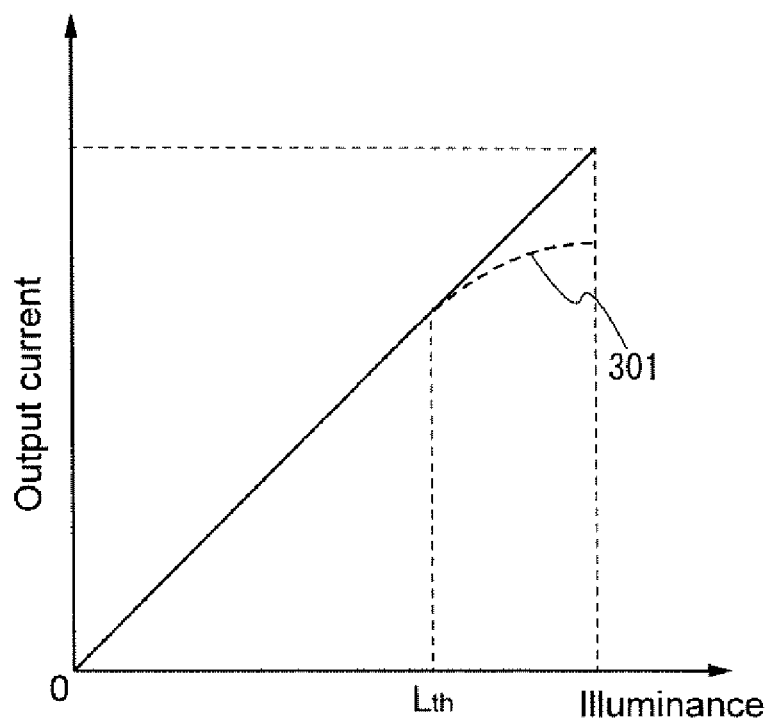
FIG. 3 illustrates Embodiment 1.

FIG. 2 illustrates a structure designed to obtain an output of the photoelectric conversion device in voltage value. The photoelectric conversion device illustrated in FIG. 2 includes an internal resistor 201 for obtaining a voltage value which is to be output to the outside of the device, and the internal resistor 201 is provided at a terminal for outputting the current $I_{out}$ from the strong light degradation correcting circuit 102, as well as the photoelectric conversion element 101 and the strong light degradation correcting circuit 102 which are illustrated in FIG. 1. Thus, the voltage $V_{out}$ can be output by the fact that the current $I_{out}$ flows through the internal resistor 201.

In this embodiment, the structure in FIG. 1 may be used to obtain a corrected photocurrent in current value. In order to obtain the photocurrent in voltage value, as illustrated in FIG. 2, the structure designed to obtain the voltage $V_{out}$, which is to be output to the outside the device, by providing the internal resistor 201 in the photoelectric conversion device 200 is used.

A block diagram added with a circuit for converting the voltage value $V_{out}$, which is an analog signal, into a digital signal, besides the photoelectric conversion device for outputting the voltage value $V_{out}$, which is described in FIG. 2 is described with reference to FIG. 4. A digital output photoelectric conversion device 400 illustrated in FIG. 4 includes an analog/digital converter circuit 401 (hereinafter also referred to as an A/D converter circuit), an address memory 402, and an I2C (inter integrated circuit) interface circuit 403, as well as the photoelectric conversion device 200 illustrated in FIG. 2. Further, the I2C interface circuit 403 is electrically connected to an external device by an I2C bus which includes a serial data line (SDA) for carrying out data communication with another device, and a serial clock line (SCL) for controlling and synchronizing data communication with another device. The I2C bus including the SDA and the SCL is a bus standard for controlling data from a microcomputer 411 by a unique address allocated to an address memory provided in each of the devices. Note that when another device is a liquid crystal display device, for example, a display driver 412 which includes an address memory 421, an I2C interface circuit 422, and a logic portion 423; and an LED driver 413 which includes an address memory 431, an I2C interface circuit 432, and a logic portion 433 are electrically connected to the I2C bus. In the case where another device is a display device including EL elements, an LED driver which controls LEDs used for a backlight is not indispensable.

Note that the analog/digital converter circuit 401 converts the voltage value $V_{out}$ to a digital signal by quantizing the voltage value $V_{out}$ which is continuous quantity. As the analog/digital converter circuit 401, for example, a flash A/D converter circuit, a pipeline A/D converter circuit, a successive-approximation A/D converter circuit, a delta-sigma A/D converter circuit, or a double-integral A/D converter circuit can be used as appropriate. A digital signal obtained by converting the voltage value $V_{out}$ in the analog/digital converter circuit 401 is transmitted to the external device such as the LED driver 413 through the I2C interface circuit 403. The LED driver 413 generates a signal for controlling the LEDs which are used for the backlight of the display device in accordance with a digital signal related to the illuminance obtained in the digital output photoelectric conversion device 400 and outputs the generated signal.

Note that although not illustrated, the digital output photoelectric conversion device 400 includes a clock generation circuit, a regulator circuit, a divider circuit, and the like. The clock generation circuit generates a clock signal which operates each circuit in the digital output photoelectric conversion device. The regulator circuit produces a potential of a power supply voltage etc. which operates each circuit in the digital output photoelectric conversion device. The divider circuit divides a clock signal to output a signal for providing a signal to each circuit in the digital output photoelectric conversion device at a predetermined time.

Figure 4:
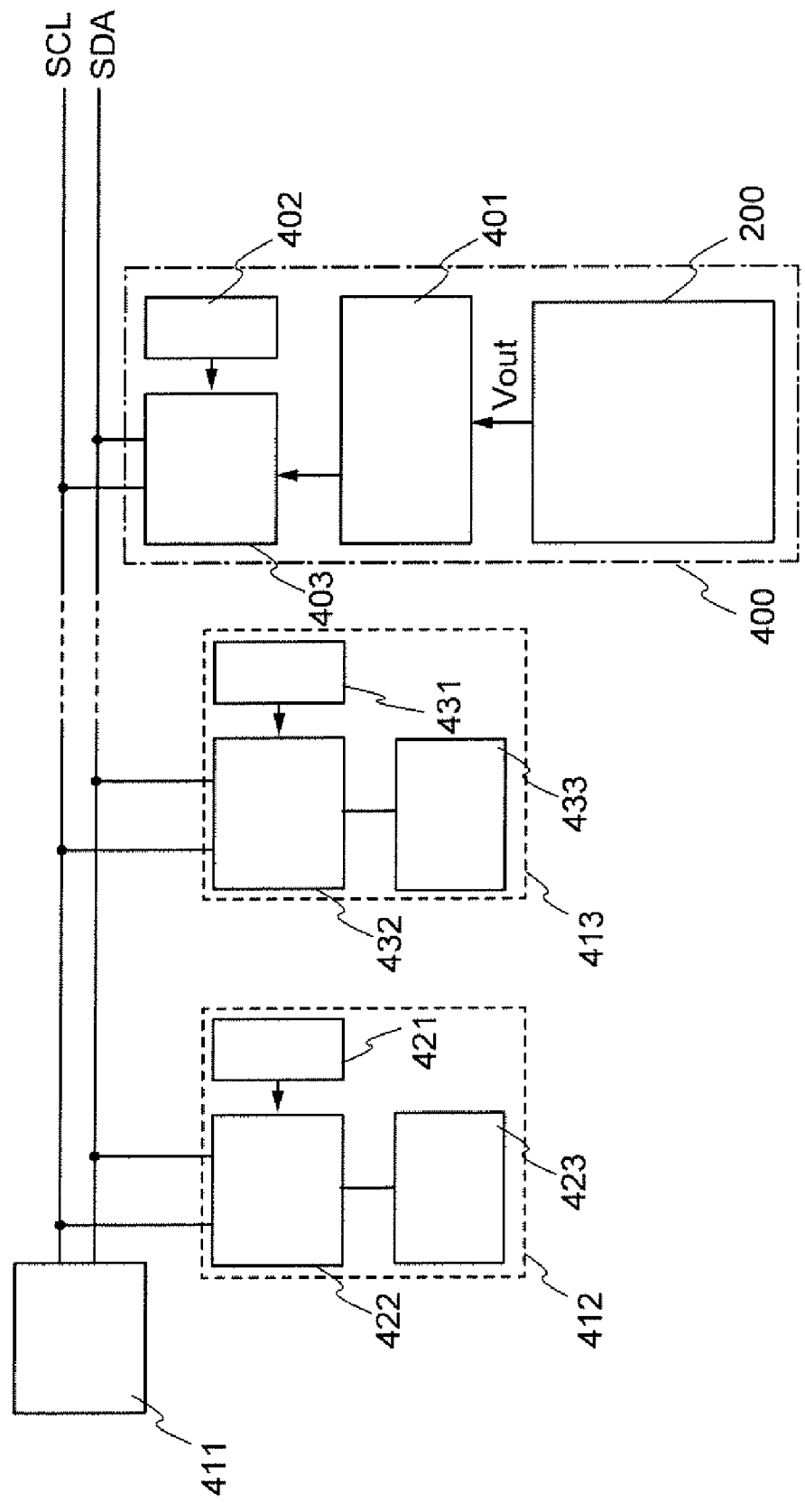
FIG. 4 illustrates Embodiment 1.
Figure 5:
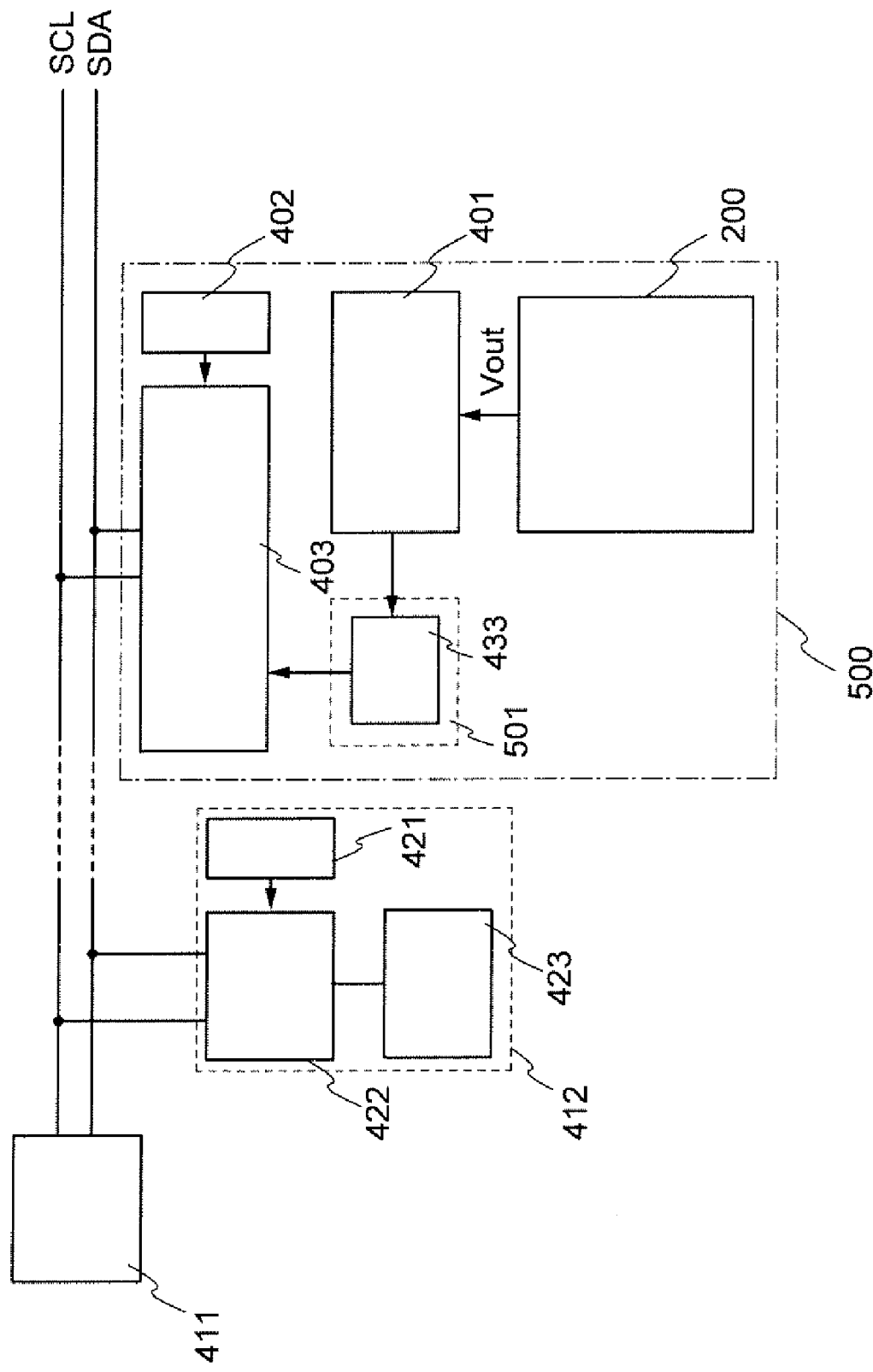
FIG. 5 illustrates Embodiment 1.

Further, FIG. 5 illustrates another structure of the digital output photoelectric conversion device 400 illustrated in FIG. 4. A digital output photoelectric conversion device 500 illustrated in FIG. 5 includes the analog/digital converter circuit 401, the address memory 402, the I2C interface circuit 403, and an LED driver 501 as well as the photoelectric conversion device 200. The I2C interface circuit 403 is electrically connected to the display driver 412 by an I2C bus which includes an SDA and an SCL. The structure illustrated in FIG. 5 differs from the structure illustrated in FIG. 4 in the way that the LED driver 501 which includes a logic portion 433 is provided in the digital output photoelectric conversion device 500. By the fact that the LED driver 501 is provided in the digital output photoelectric conversion device 500, a digital signal generated in the analog/digital converter circuit 401 can be directly received by the LED driver 501 and can be output from the I2C interface circuit 403. Thus, the circuits can be shared, and miniaturization and high added value are achieved.

Note that in FIG. 4 and FIG. 5, as the interface of each circuit, an I2C interface, which is one of digital serial interfaces, is used, for example. Note also that other than the I2C bus, a bus standard such as the Universal Serial Bus or the Serial Peripheral Interface can be used.

Next, an example of the specific circuit structure of the photoelectric conversion device 100 illustrated in FIG. 1 is described. In the photoelectric conversion device 100 illustrated in FIG. 6, the photocurrent output circuit 103 included in the strong light degradation correcting circuit 102 includes a first n-channel transistor 601, a second n-channel transistor 602, a third n-channel transistor 603, a first p-channel transistor 604, and a second p-channel transistor 605. The photocurrent correcting circuit 104 included in the strong light degradation correcting circuit 102 includes the corrective photoelectric conversion element 107 which includes the photoelectric conversion element 108 shielded from light by the light shield film 109, a fourth n-channel transistor 606, and a fifth n-channel transistor 607. The photocurrent adder circuit 105 included in the strong light degradation correcting circuit 102 includes a third p-channel transistor 608, a fourth p-channel transistor 609, a sixth n-channel transistor 610, and a seventh n-channel transistor 611. The amplifier circuit 106 included in the strong light degradation correcting circuit 102 includes a fifth p-channel transistor 612 and a sixth p-channel transistor 613.

One terminal (the cathode side) of the photoelectric conversion element 101 is supplied with the high power supply potential (Vdd) and the other terminal (the anode side) thereof is electrically connected to each gate terminal of the first n-channel transistor 601 to the third n-channel transistor 603 and to a first terminal of the first n-channel transistor 601.

The low power supply potential Vss is applied to each second terminal of the first n-channel transistor 601 to the third n-channel transistor 603. A first terminal of the second n-channel transistor 602 is electrically connected to a gate terminal and a second terminal of the fifth p-channel transistor 612 and to a first terminal of the seventh n-channel transistor 611. A first terminal of the third n-channel transistor 603 is electrically connected to a gate terminal and a second terminal of the first p-channel transistor 604 and to a gate terminal of the second p-channel transistor 605. The high power supply potential Vdd is applied to a first terminal of the first p-channel transistor 604 and to a first terminal of the second p-channel transistor 605. A second terminal of the second p-channel transistor 605 is electrically connected to a first terminal of the fifth n-channel transistor 607, to a gate terminal and a second terminal of the third p-channel transistor 608, and to a gate terminal of the fourth p-channel transistor 609.

One terminal (the cathode side) of the photoelectric conversion element 108 shielded from light is supplied with the high power supply potential (Vdd), and the other terminal (the anode side) thereof is electrically connected to each gate terminal of the fourth n-channel transistor 606 and the fifth n-channel transistor 607 and to a first terminal of the fourth n-channel transistor 606. The low power supply potential Vss is applied to each second terminal of the fourth n-channel transistor 606 and the fifth n-channel transistor 607.

The high power supply potential Vdd is applied to a first terminal of the third p-channel transistor 608 and to a first terminal of the fourth p-channel transistor 609. A second terminal of the fourth p-channel transistor 609 is electrically connected to a gate terminal and a second terminal of the sixth n-channel transistor 610 and to a gate terminal of the seventh n-channel transistor 611. The low power supply potential Vss is applied to a second terminal of the sixth n-channel transistor 610 and to a second terminal of the seventh n-channel transistor 611.

The high power supply potential Vdd is applied to a first terminal of the fifth p-channel transistor 612 and to a first terminal of the sixth p-channel transistor 613. A second terminal of the sixth p-channel transistor 613 outputs the corrected photocurrent $I_{out}$.

Figure 6:
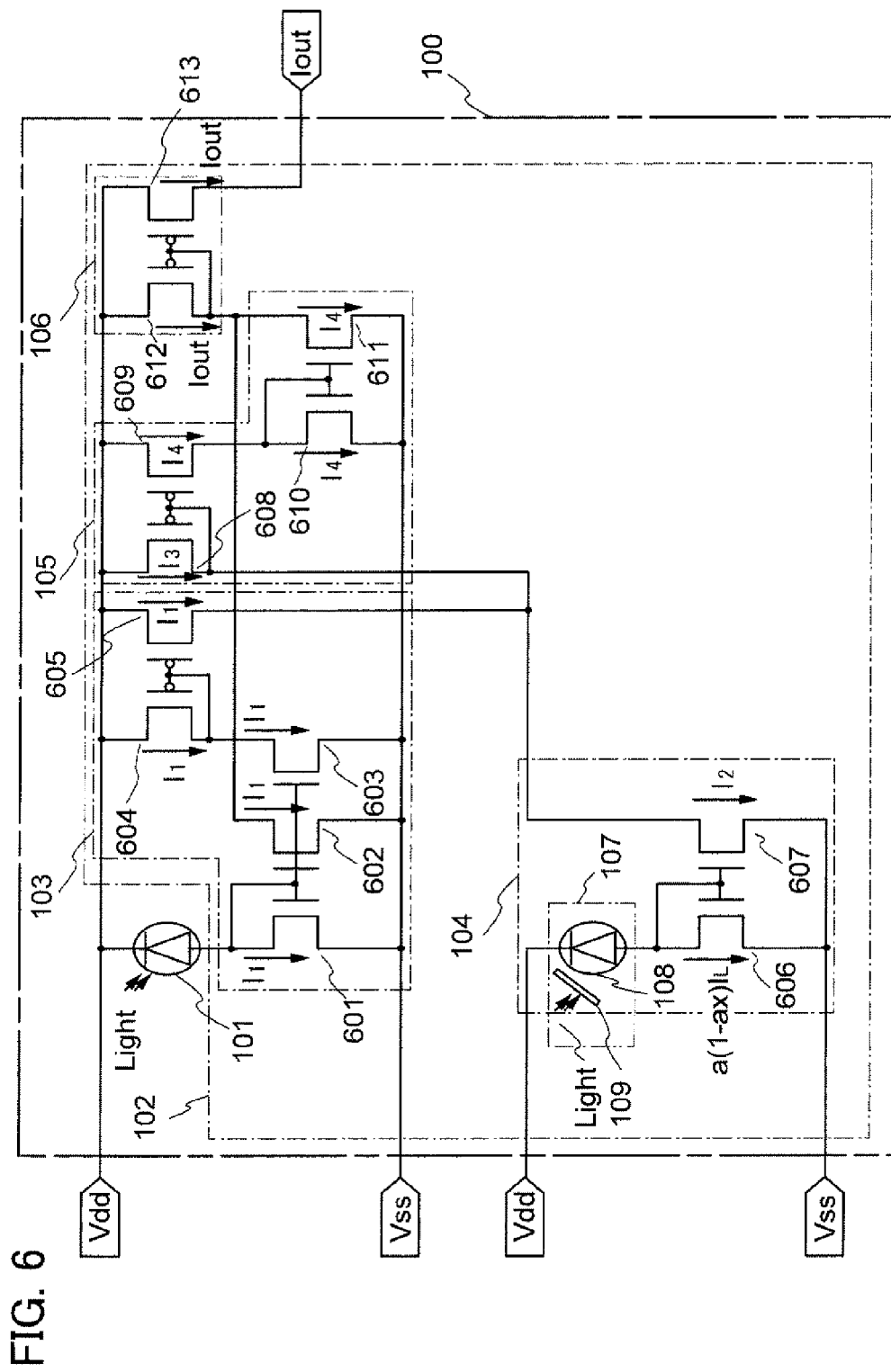
FIG. 6 illustrates Embodiment 1.

As illustrated in FIG. 6, in the photocurrent output circuit 103, the first n-channel transistor 601, the second n-channel transistor 602, and the third n-channel transistor 603 construct a current mirror circuit (also referred as a first current mirror circuit). The first p-channel transistor 604 and the second p-channel transistor 605 construct a current mirror circuit (also referred as a second current mirror circuit). The fourth n-channel transistor 606 and the fifth n-channel transistor 607 construct a current mirror circuit (also referred as a third current mirror circuit). The third p-channel transistor 608 and the fourth p-channel transistor 609 construct a current mirror circuit (also referred as a fourth current mirror circuit). The sixth n-channel transistor 610 and the seventh n-channel transistor 611 construct a current mirror circuit (also referred as a fifth current mirror circuit). The fifth p-channel transistor 612 and the sixth p-channel transistor 613 construct a current mirror circuit (also referred as a sixth current mirror circuit).

Note that the first current $I_1$ described with reference to FIG. 1 corresponds to a current which flows through the first n-channel transistor 601, the second n-channel transistor 602, the third n-channel transistor 603, the first p-channel transistor 604, and the second p-channel transistor 605. The second current $I_2$ described with reference to FIG. 1 corresponds to a current which flows through the fifth n-channel transistor 607. The third current $I_3$ described with reference to FIG. 1 corresponds to a current which flows through the third p-channel transistor 608. The fourth current $I_4$ described with reference to FIG. 1 corresponds to a current which flows through the fourth p-channel transistor 609, the sixth n-channel transistor 610, and the seventh n-channel transistor 611. The corrected photocurrent $I_{out}$ which is described with reference to FIG. 1 corresponds to a current which flows through the fifth p-channel transistor 612 and the sixth p-channel transistor 613.

Note that a current which flows through the fourth n-channel transistor 606 corresponds to a current which flows from the corrective photoelectric conversion element 107 which includes the photoelectric conversion element 108 shielded from light by the light shield film 109. Specifically, when transmittance of the light shield film is denoted by a (0<a<1), degradation rate of the output of the photoelectric conversion element in response to irradiation with the strong light is denoted by x (0≦x<1), and a photocurrent corresponding to the illuminance obtained when correction is not performed is $I_L$, a current which flows through the fourth n-channel transistor 606 is expressed as a $(1-ax)I_L$.

Note that the photoelectric conversion element 108 shielded from light is preferably formed in the same conditions and in the same size as the photoelectric conversion element 101. That is, the photoelectric conversion element 108 without the light shield film 109 can preferably output the same magnitude of current as the photoelectric conversion element 101 with respect to the illuminance. Moreover, the light shield film 109 is preferably provided on the side where light is incident on the photoelectric conversion element 108 which is shielded from light, and the light shield film 109 is preferably formed using a material which can obtain a predetermined light transmittance. For example, the light shield film 109 is formed by providing a thin film of silicon or the like on the side where light enters on the photoelectric conversion element 108 which is shielded from light.

Note that a transistor such as an n-channel transistor or a p-channel transistor is an element which includes at least three terminals of a gate, a drain, and a source. The transistor has a channel region between a drain region and a source region and current can be supplied through the drain region, the channel region, and the source region. Here, since a source and a drain are switched with each other depending on the structure, operating condition, or the like of the transistor, it is difficult to determine which is the source or the drain in some cases. Accordingly, in this embodiment, one of regions which function as a source and a drain is referred to as a first terminal and the other region is referred to as a second terminal. Further, a terminal which serves as the gate is referred to as a gate.

Note that as a transistor such as an n-channel transistor and a p-channel transistor, a variety of types of transistors can be used. For example, a thin film transistor (TFT) including a non-single-crystal semiconductor film typified by amorphous silicon, polycrystalline silicon, microcrystalline (also referred to as microcrystal or semi-amorphous) silicon, or the like can be used. When using a TFT, a comparatively low temperature process can be employed to manufacture a photoelectric conversion device, whereby a large-sized manufacturing apparatus can be used to manufacture the photoelectric conversion device over a large-sized substrate. Accordingly, a large number of photoelectric conversion devices can be obtained in one manufacturing process at low manufacturing costs. Further, a comparatively low temperature process is employed to manufacture a photoelectric conversion device, whereby a substrate with low heat resistance can be used. Accordingly, a transistor can be manufactured over a light-transmitting substrate (e.g., a glass substrate having an insulating surface), and the transistor formed over a light-transmitting substrate can be used for a device which utilizes transmission of light.

Figure 7:
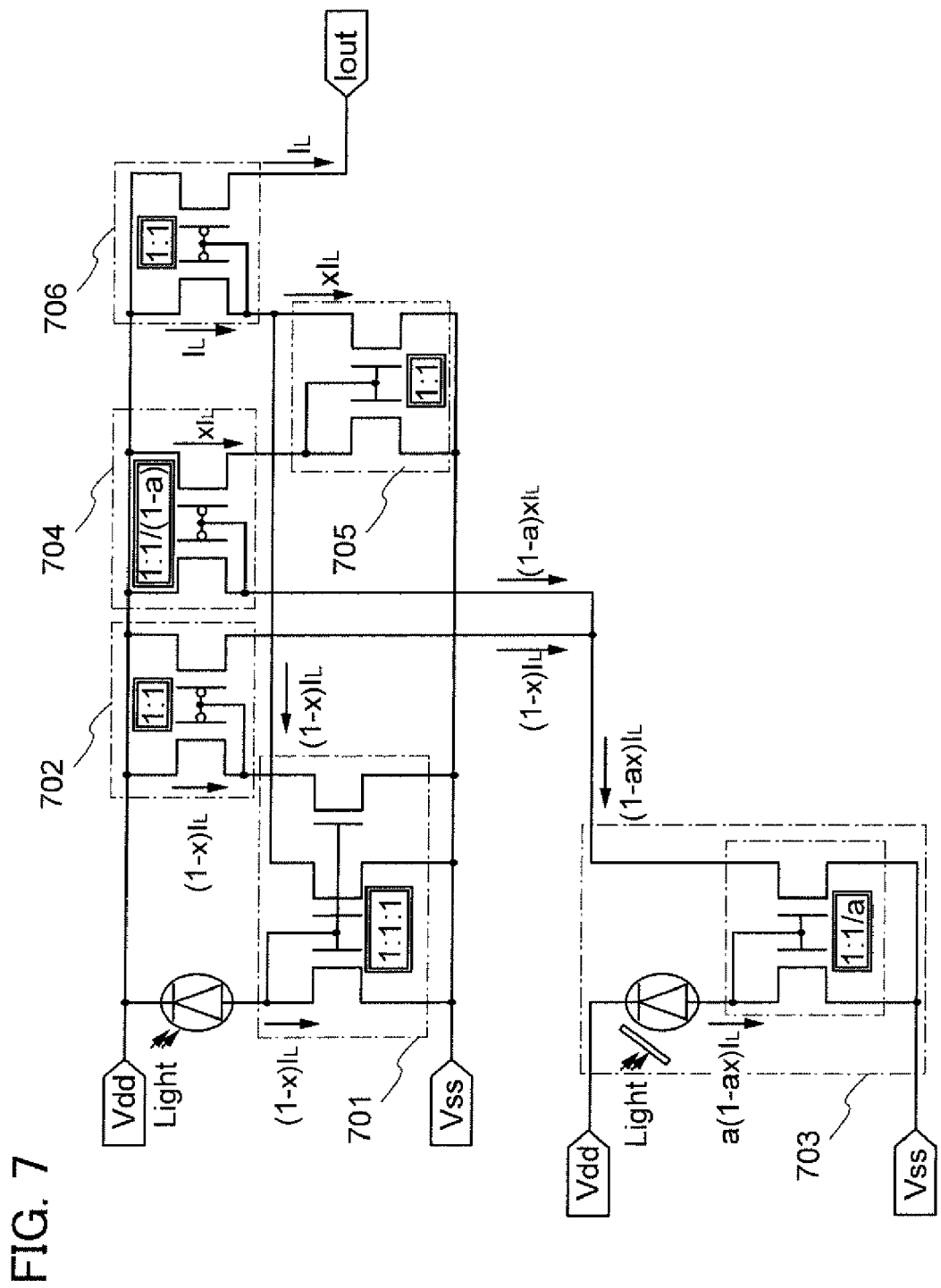
FIG. 7 illustrates Embodiment 1.

Next, FIG. 7 illustrates an amplification factor of a current in each current mirror circuit which includes transistors and the photoelectric conversion device which corrects a decrease in output current of a photocurrent, which occurs due to reception of strong light, is further described using the amplification factor of each of the current mirror circuits. Note that in FIG. 7, the current mirror circuits each of which includes transistors, which are described in FIG. 6, are illustrated by using a first current mirror circuit 701, a second current mirror circuit 702, a third current mirror circuit 703, a fourth current mirror circuit 704, a fifth current mirror circuit 705, and a sixth current mirror circuit 706, which are designated by reference numerals. Further, FIG. 7 also illustrates the magnitude of a current flowing through each wiring.

First, the first current mirror circuit 701 is described. A photo current $(1-x)I_L$ ($I_L$ is a photocurrent without being affected by degradation due to strong light) from the photoelectric conversion element 101 flows through the first current mirror circuit 701 as the first current $I_1$ illustrated in FIG. 1. As described above, since x is the degradation rate of the photoelectric conversion element 101 and is 0 when strong light is not irradiated and degradation does not appear, the first current, for example, can be also $I_L$. The first current mirror circuit 701 is designed to make a current of the same magnitude as a current which flows through the first n-channel transistor 601 flow through the second n-channel transistor 602 and through the third n-channel transistor 603. That is, the first current mirror circuit 701 is designed to have an amplification factor of 1. For example, a channel region of the first n-channel transistor 601 may be formed in the same size as a channel region of the second n-channel transistor 602 and third n-channel transistor 603. Note that the size of the channel region corresponds to a region whose area is equivalent to the product of the width of the channel region and length between a source and a drain.

Next, as illustrated in FIG. 1, the second current mirror circuit 702 is described. The first current $I_1$ which flowing the third n-channel transistor 603 flows through the second current mirror circuit 702. That is, the photocurrent $(1-x)I_L$ from the photoelectric conversion element 101 flows through the second current mirror circuit 702. The second current mirror circuit 702 is designed to make a current of the same magnitude as a current which flows through the first p-channel transistor 604 flow through the second p-channel transistor 605. That is, the second current mirror circuit 702 is designed to have an amplification factor of 1. For example, a channel region of the first p-channel transistor 604 may be formed in the same size as a channel region of the second p-channel transistor 605.

Next, the third current mirror circuit 703 is described. As described above, in the third current mirror circuit 703, the current a $(1-ax)I_L$ flows through the fourth n-channel transistor 606 due to the light irradiated to the photoelectric conversion element 108 shielded from light. The third current mirror circuit 703 is designed to make the current $(1-ax)I_L$ flow through the fifth n-channel transistor 607 as the second current $I_2$ whose magnitude is 1/a of that of a current flowing through the fourth n-channel transistor 606. That is, the third current mirror circuit 703 is designed to have an amplification factor of 1/a. For example, a channel region of the fourth n-channel transistor 606 may be formed in the same size as a channel region of the fifth n-channel transistor 607.

Next, the fourth current mirror circuit 704 is described. As illustrated in FIG. 1, the third current $I_3$ corresponding to a difference between the second current a $(1-ax)I_L$ and the first current $(1-x)I_L$ flows through the fourth current mirror circuit 704. That is, a current $(1-a)xI_L$ which is the difference between the second current a $(1-ax)I_L$ and the first current $(1-x)I_L$ flows through the fourth current mirror circuit 704. The fourth current mirror circuit 704 is designed to make a current $xI_L$ flow through the fourth p-channel transistor 609 as the fourth current $I_4$ whose magnitude is $1/(1-a)$ of that of a current flowing through the third p-channel transistor 608. That is, the fourth current mirror circuit 704 is designed to have an amplification factor of $1/(1-a)$. For example, a channel region of the third p-channel transistor 608 may be formed in the same size as a channel region of the fourth p-channel transistor 609.

Next, the fifth current mirror circuit 705 is described. As illustrated in FIG. 1, the fourth current $I_4$, which has flowed through the fourth p-channel transistor 609, flows through the fifth current mirror circuit 705. That is, the current $xI_L$ flows through the fifth current mirror circuit 705. The fifth current mirror circuit 705 is designed to make a current of the same magnitude as a current which flows through the sixth n-channel transistor 610 flow through the seventh n-channel transistor 611. That is, the fifth current mirror circuit 705 is designed to have an amplification factor of 1. For example, a channel region of the sixth n-channel transistor 610 may be formed in the same size as a channel region of the seventh n-channel transistor 611.

Next, the sixth current mirror circuit 706 is described. As illustrated in FIG. 1, the current $I_L$ corresponding to the sum of the first current $(1-x)I_L$ and the fourth current $xI_L$, that is, the corrected current $I_{out}$, flows through the sixth current mirror circuit 706. The sixth current mirror circuit 706 is designed to make a current of the same magnitude as a current which flows through the fifth p-channel transistor 612 flow through the sixth p-channel transistor 613. That is, the sixth current mirror circuit 706 is designed to have an amplification factor of 1. For example, a channel region of the fifth p-channel transistor 612 may be formed in the same size as a channel region of the sixth p-channel transistor 613.

Note that a plurality of the sixth p-channel transistors 613 which constructs the sixth current mirror circuit 706 in the amplifier circuit 106 may be electrically connected in parallel with each other. By providing a plurality of the sixth p-channel transistors 613, the corrected photocurrent $I_{out}$ can be multiplied by n times (n is a natural number) and the multiplied photocurrent can be output. Therefore, even when the corrected photocurrent $I_{out}$ is small, sufficient corrected photocurrent $I_{out}$ can be output. Alternatively, sufficient current can be supplied by making the channel width of the sixth p-channel transistor 613 larger or making the channel length of the sixth p-channel transistor 613 smaller.

Specific driving of the photoelectric conversion device described in this embodiment and the advantages thereof are described with reference to FIG. 8 and FIG. 9. As a specific example, in FIG. 8, the case is described where the light received by the photoelectric conversion element 101 has illuminance which does not cause degradation in the photoelectric conversion element. That is, in the example shown in FIG. 8, when the transmittance of the light shield film is denoted by a ($0<a<1$) and the degradation rate of the output of the photoelectric conversion element in response to irradiation with the strong light is denoted by x ($0 \leq x<1$), the transmittance a is 0.4, the degradation rate x is 0, and a photocurrent corresponding to the illuminance obtained when correction is not performed is $I_L$. Further, in FIG. 9, the case is described where the light received by the photoelectric conversion element 101 has illuminance which does not cause degradation in the photoelectric conversion element. That is, in an example shown in FIG. 9, the transmittance a is 0.4, the degradation rate x is 0.2, and a photocurrent corresponding to the illuminance obtained when correction is not performed is $I_L$.

Figure 8:
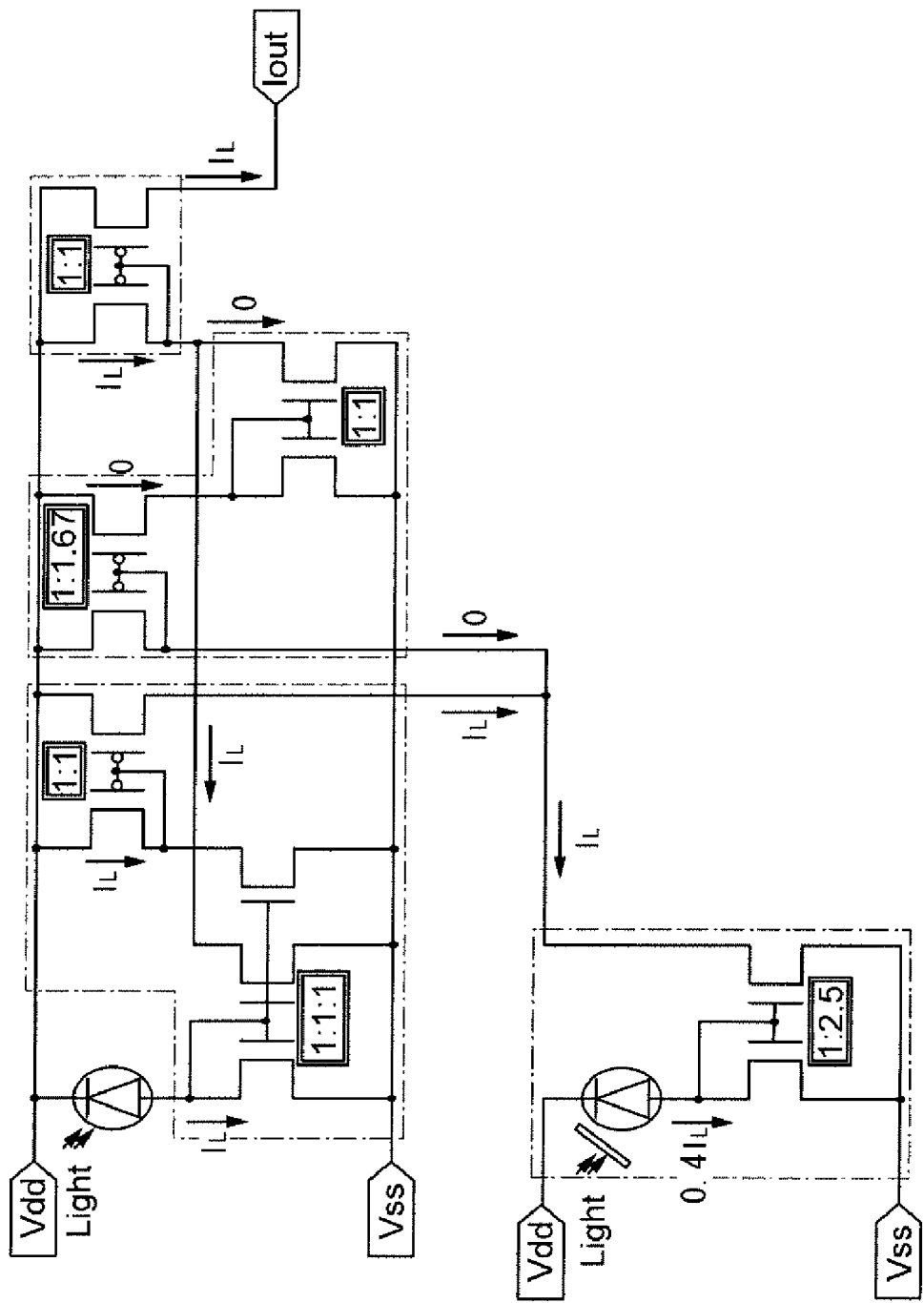
FIG. 8 illustrates Embodiment 1.

In FIG. 8, the current $I_L$ flows through the first current mirror circuit 701, the current $I_L$ flows through the second current mirror circuit 702, a current $0.4I_L$ flows through the third current mirror circuit 703, no current flows through the fourth current mirror circuit 704, no current flows through the fifth current mirror circuit 705, and the current $I_L$ flows through the sixth current mirror circuit 706.

Figure 9:
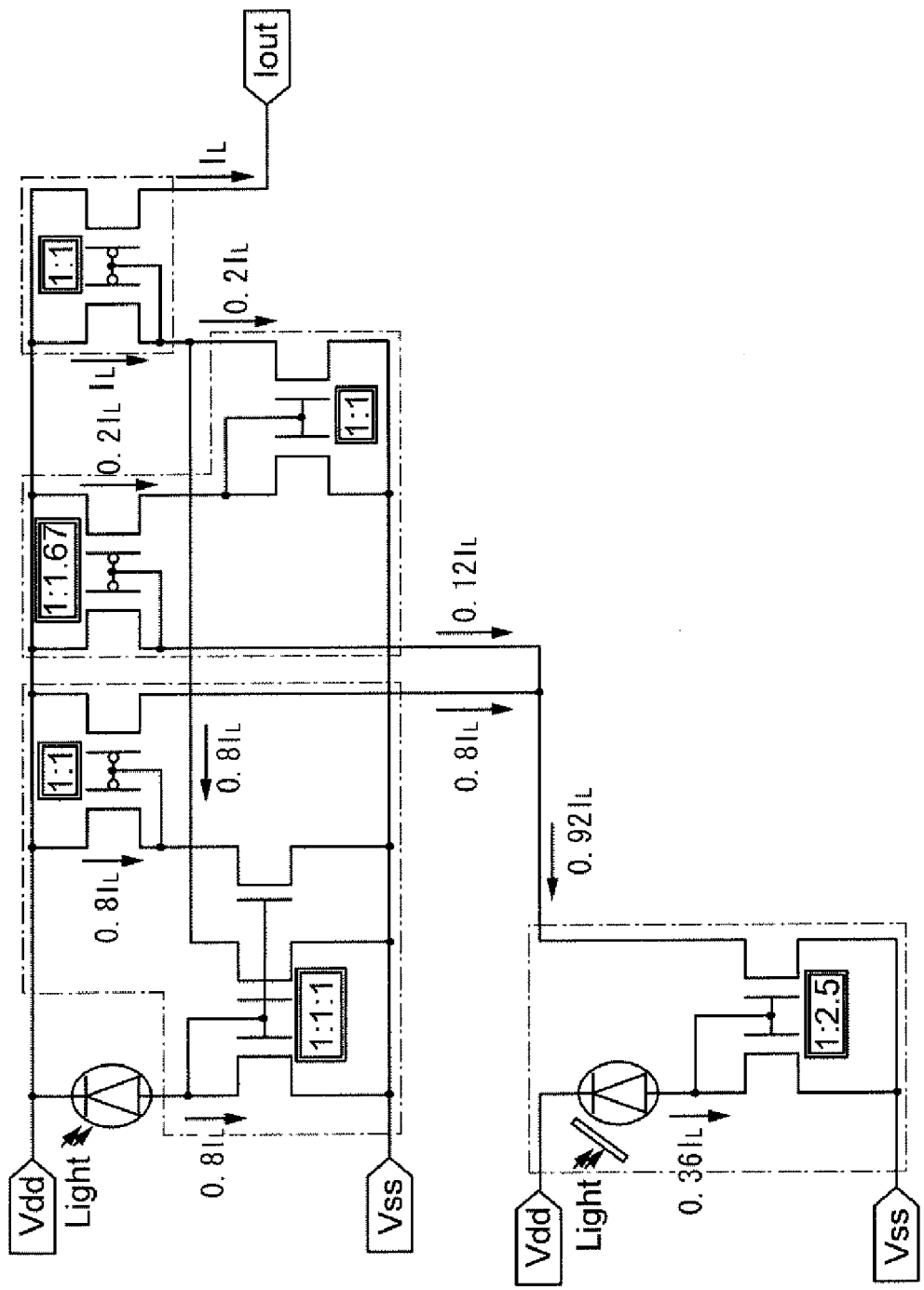
FIG. 9 illustrates Embodiment 1.

On the other hand, in FIG. 9, a current $0.8I_L$ flows through the first current mirror circuit 701, the current $0.8I_L$ flows through the second current mirror circuit 702, a current $0.36I_L$ flows through the third current mirror circuit 703, a current $0.12I_L$ flows through the fourth current mirror circuit 704, a current $0.2I_L$ flows through the fifth current mirror circuit 705, and the current $I_L$ flows through the sixth current mirror circuit 706.

In this manner, as specifically described in FIG. 8 and FIG. 9, despite the illuminance of the light irradiated to the photoelectric conversion element, the photoelectric conversion device can output a current corresponding to the photocurrent $I_L$.

As described above, with the structure of the photoelectric conversion device in this embodiment, the photoelectric conversion device can be obtained which corrects a difference between a measured light intensity and the actual light intensity, which occurs when output current decreases due to the fact that a strong light is received, and outputs the corrected current. Further, with the structure described in this embodiment, correction is not performed when the illuminance is low, so that the photoelectric conversion device can be obtained in which an output current corresponding to the illuminance can be obtained without degradation in dynamic range.

Note that what is illustrated in the drawing can be freely combined with or replaced with what is described in other embodiments as appropriate.

Embodiment 2

In this embodiment, a method for manufacturing a photoelectric conversion device is described in detail with reference to FIGS. 10A to 10C and FIGS. 11A and 11B. Note that in this embodiment, an example of part of the photoelectric conversion device is described which includes a thin film transistor (TFT) which is an element included in each circuit in the photoelectric conversion device, a vertical-junction PIN photodiode (hereinafter also referred to as a photodiode) which is a corrective photoelectric conversion element, and a light shield film. Note that as the photoelectric conversion device, as well as a TFT and a PIN photodiode, a memory element, a resistor, a diode, a capacitor, an inductor, or the like can also be used. Further, as the photoelectric conversion device, a vertical junction PN photodiode may also be used instead of the vertical-junction PIN photodiode.

First, a light-transmitting substrate 1301 is prepared. As the substrate 1301, a glass substrate of barium borosilicate glass, aluminum borosilicate glass, or the like; a quartz substrate; or the like can be used, for example. A thin film transistor is used as a transistor formed over the substrate so that a photodiode and the thin film transistor can be formed over the substrate in the same steps; therefore, there is an advantage that the photoelectric conversion devices are easily produced in large quantities.

Next, a silicon nitride oxide film (140-nm-thick) and a silicon oxynitride film (100-nm-thick) which serve as a base insulating film 1302 are stacked in the order presented by a plasma CVD method, and a semiconductor film, for example, an amorphous silicon film (50-nm-thick) containing hydrogen is stacked thereover without being exposed to the atmosphere. Note that the silicon nitride oxide film serves as a blocking layer that prevents diffusion of impurities such as an alkali metal from the glass substrate.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 to 30 at. %, 20 to 55 at. %, 25 to 35 at. %, and 10 to 25 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Then, the amorphous silicon film is crystallized by a known technique (e.g., a solid-phase growth method, a laser crystallization method, or a crystallization method using a catalytic metal) to form a semiconductor film (a crystalline semiconductor film) having a crystalline structure, for example, a polycrystalline silicon film.

Then, on the obtained semiconductor film (e.g., the crystalline silicon film) having a crystalline structure, a resist mask is formed using a first photomask, and the semiconductor film is etched into a desired shape to form a semiconductor film (in this specification, referred to as an island-shaped semiconductor region 1303a) which is separated into an island shape, and to form a light shield film 1303b. After the island-shaped semiconductor region is formed, the resist mask is removed.

By forming the light shield film 1303b for correcting for strong light with the use of a semiconductor film, the light shield film can be formed with a small change in the layout. Note that the forming method of the light shield film is not limited thereto, so that the light shield film may be formed with the use of another material.

Next, a very small amount of an impurity element (boron or phosphorus) is added in order to control the threshold value of the TFT, if necessary. Here, an ion doping method is used, in which diborane ($B_2H_6$) is not separated by mass but excited by plasma.

Then, an insulating film containing silicon as its main component, which serves as a gate insulating film 1304, is formed. In this case, a silicon oxynitride film is formed to a thickness of 30 nm by a plasma CVD method.

Next, after a conductive film is formed over the gate insulating film 1304, a gate electrode 1305 is formed with the use of a second photomask (see FIG. 10A). As the conductive film, a stacked-layer film of 30-nm-thick tantalum nitride and 170-nm-thick tungsten (W) is used, for example.

Alternatively, as the gate electrode 1305, instead of the above film, a single-layer film of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), or a single-layer film of an alloy material or a compound material containing any of the above elements as its main component; or a single-layer film of nitride of any of the above elements, for example, titanium nitride, tungsten nitride, tantalum nitride, or molybdenum nitride can be used.

Then, an impurity imparting one conductivity type is introduced into the island-shaped semiconductor region 1303a to form a source region and a drain region of a TFT. In this embodiment, an n-channel TFT is formed as an example; therefore, an impurity imparting n-type conductivity, such as phosphorus (P) or arsenic (As), is introduced into the island-shaped semiconductor region 1303a. When a p-channel TFT is formed, a p-type impurity is introduced into the island-shaped semiconductor region 1303a. Note that in a similar way to the island-shaped semiconductor region 1303a, an impurity imparting one conductivity type may be introduced into the light shield film 1303b. By improving the conductivity of the light shield film 1303b, the light shield film can also be used as a wiring between the circuit elements.

Next, as a first interlayer insulating film, a silicon oxynitride film (50-nm-thick (not illustrated)), a silicon nitride oxide film 1306 (165-nm-thick), and a silicon oxynitride film 1307 (600-nm-thick) are formed.

Then, thermal treatment (300 to 550° C. for one to 12 hours, e.g., 410° C. for 1 hour in a nitrogen atmosphere) is performed to hydrogenate the island-shaped semiconductor film. This step is performed in order to terminate dangling bonds in the island-shaped semiconductor film with hydrogen contained in the silicon oxynitride film.

Next, a resist mask is formed with the use of a third photomask, and the first interlayer insulating film and the gate insulating film 1304 are selectively etched so that contact holes are formed. Then, the resist mask is removed.

Next, after a conductive stacked-layer film is formed by a sputtering method, a resist mask is formed with the use of a fourth photomask, and then, the conductive stacked-layer film is selectively etched to form a first wiring 1308 (see FIG. 10B). Then, the resist mask is removed. Note that the conductive film in this embodiment is a stacked-layer of three films: a 100-nm-thick Ti film, a 100-nm-thick Al film, and a 50-nm-thick Ti film.

A top gate TFT 1309 using a polycrystalline silicon film can be formed through the above steps.

Next, an organic resin 1310 (1.5-µm-thick) is formed over the first interlayer insulating film and the first wiring 1308 as a second interlayer insulating film. Polyimide is used as the organic resin 1310. Alternatively, the organic resin 1310 may be formed using an organic material having heat resistance, such as acrylic, benzocyclobutene, polyamide, or epoxy. Then, a resist mask is formed over the organic resin 1310 with the use of a fifth photomask, and the organic resin 1310 is selectively etched. Then, the resist mask is removed.

Next, as the second interlayer insulating film, a silicon nitride film 1311 (100-nm-thick) and a silicon oxide film 1312 (200-nm-thick) are formed in the order presented over the organic resin 1310. A resist mask is formed with the use of a sixth photomask, and the silicon nitride film 1311 and the silicon oxide film 1312 are selectively etched. Then, the resist mask is removed. The silicon oxide film 1312 can be formed using a mixed gas of silane and oxygen or of tetraethoxysilane (TEOS) and oxygen, for example, by a method such as thermal CVD, plasma-enhanced CVD, atmospheric pressure CVD, or bias ECRCVD. Typically, the silicon nitride film 1311 can be formed using a mixed gas of silane and ammonia by plasma-enhanced CVD.

Next, after a conductive film using a Ti film is formed over the second interlayer insulating film and the first wiring 1308, a resist mask is formed with the use of a seventh photomask, and the conductive film is selectively etched so that a second wiring 1313 is formed. Note that the second wiring 1313 is etched using a halftone exposure technique or the like so that end portions of the second wiring 1313 are tapered.

Next, a corrective photoelectric conversion element 1314 which is a photodiode is formed over part of the second interlayer insulating film and the second wiring 1313 which overlap with the light shield film 1303b (see FIG. 10C). In this case, the corrective photoelectric conversion element 1314 is formed using an amorphous silicon film having a three-layer structure where a layer which has p-type conductivity (60-nm-thick), a layer which has i-type conductivity (400-nm-thick), and a layer which has n-type conductivity (80-nm-thick) are stacked. The corrective photoelectric conversion element 1314 is obtained in such a manner that the three layers are sequentially stacked to serve as the amorphous silicon film, a resist mask is formed with the use of an eighth photomask and then, the amorphous silicon film is selectively etched. Then, the resist mask is removed.

Note that as a photoelectric conversion element without a light shield film, a photodiode is formed below the second interlayer insulating film and the second wiring 1313 in a portion where the light shield film is not provided.

Figure 11A:
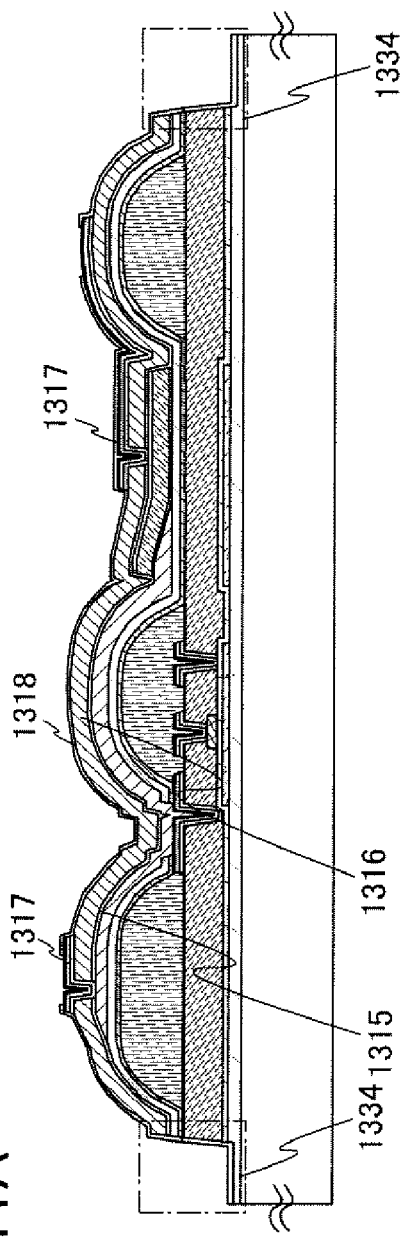
FIGS. 11A and 11B each illustrate Embodiment 2.
Figure 11B:
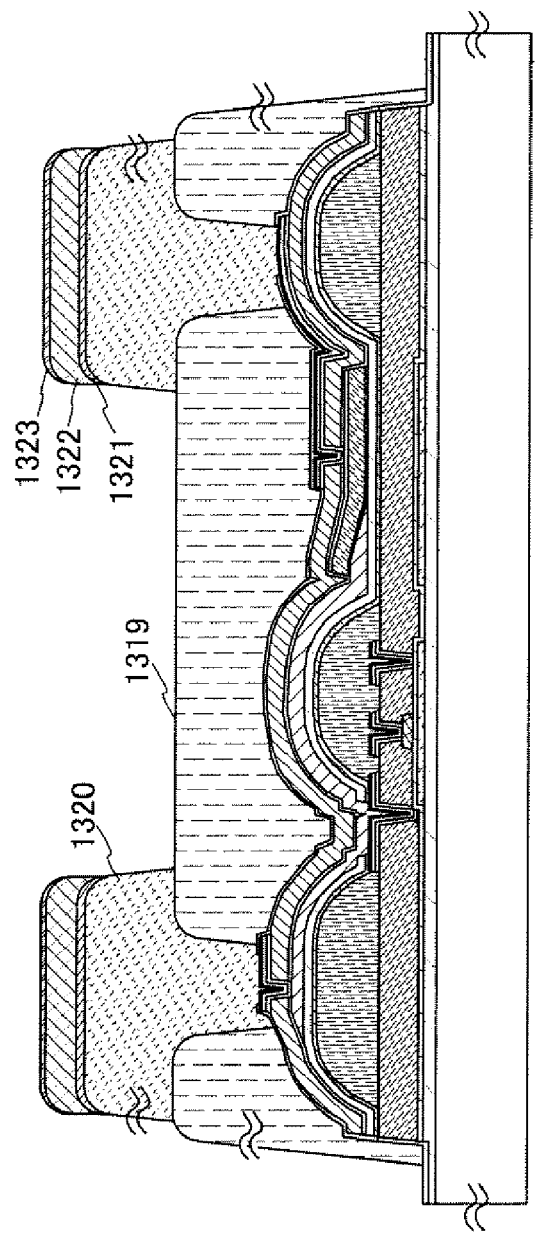

Note that over one substrate 1301, a plurality of photoelectric conversion devices are formed at the same time through the same steps. Therefore, it is necessary to cut and separate the substrate 1301 in accordance with the size of the plurality of photoelectric conversion devices. In order to prevent impurities from entering side surfaces of the divided photoelectric conversion device, part of the stacked film is removed as illustrated in FIG. 11A, which is formed over the silicon nitride oxide film in the base insulating film 1302 in regions 1334 (portions expressed by dashed lines) that are to be the side surfaces of the photoelectric conversion device. In this step, a resist mask is formed with the use of a ninth photomask, and etching treatment is selectively performed. Then, the resist mask is removed.

Next, over the silicon nitride oxide film serving as the base insulating film 1302, the silicon oxide film 1312 serving as the second interlayer insulating film, the second wiring 1313, and the corrective photoelectric conversion element 1314, a silicon nitride film 1315 (100-nm-thick) and a silicon oxide film 1316 (400-nm-thick) are formed in the order presented to be a third interlayer insulating film. A resist mask is formed with the use of a tenth photomask, and the silicon nitride film 1315 and the silicon oxide film 1316 are selectively etched. Then, the resist mask is removed.

Then, after a conductive stacked film is formed over the third interlayer insulating film, the second wiring 1313, and the corrective photoelectric conversion element 1314, a resist mask is formed with the use of an eleventh photomask, and the conductive stacked film is selectively etched so that third wirings 1317 are formed. Note that the conductive film in this embodiment has a three-layer structure where a 50-nm-thick Ti film, a 100-nm-thick Al film, and a 50-nm-thick Ti film are stacked.

Next, over the silicon oxide film 1316 serving as the third interlayer insulating film and the third wirings 1317, and in the regions 1334 which are the side surfaces of the photoelectric conversion device, a silicon nitride film 1318 (100-nm-thick) is formed (see FIG. 11A). A resist mask is formed with the use of a twelfth photomask, and the silicon nitride film 1315 and the silicon oxide film 1316 are selectively etched. Then, the resist mask is removed.

Next, an insulating resin film 1319 (25-μm-thick) is formed. With the insulating resin film 1319, a top surface and side surfaces of a layer including the TFT 1309 are sealed. A photosensitive epoxy-phenolic resin film is formed to be the insulating resin film 1319 by a printing method. Note that opening portions for inputting and outputting signals from the photoelectric conversion device are provided in the insulating resin film 1319.

Next, a terminal electrode of the photoelectric conversion device is formed over the insulating resin film 1319. First, conductive films, which are to be first conductive films 1320, are formed to a thickness of approximately 15 μm by a screen printing method with the use of a conductive paste containing nickel particles.

A conductive paste is a material in which conductive particles or conductive powder is dispersed into a binder formed using a resin. By solidifying such a conductive paste, a conductive resin film is formed. Thus, since the first conductive films 1320 is formed using a conductive resin film, adhesion thereof to a solder is weak. Therefore, in order to improve the adhesion of the terminal electrode to a solder, conductive films having predetermined shapes are formed over a top surface of the first conductive films 1320 by a sputtering method using a metal mask. For example, over the first conductive films 1320, titanium films 1321 (150-nm-thick), nickel films 1322 (750-nm-thick), and gold (Au) films 1323 (50-nm-thick) are stacked in the order presented (see FIG. 11B).

Note that as for the photoelectric conversion device, the substrate 1301 is cut into separate photoelectric conversion devices. The substrate 1301 can be cut by a dicing method, a laser cutting method, or the like.

Through the above steps, the photoelectric conversion device can be manufactured.

Note that what is illustrated in the drawing can be freely combined with or replaced with what is described in other embodiments as appropriate.

Embodiment 3

Figure 12A:
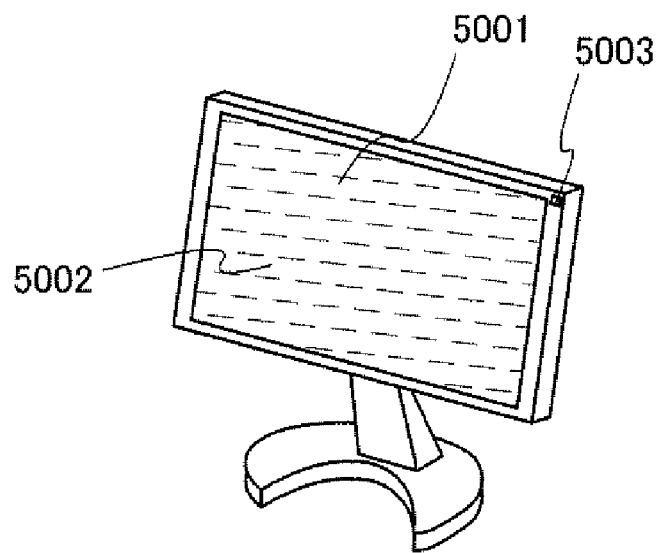
FIGS. 12A and 12B each illustrate Embodiment 3.
Figure 12B:
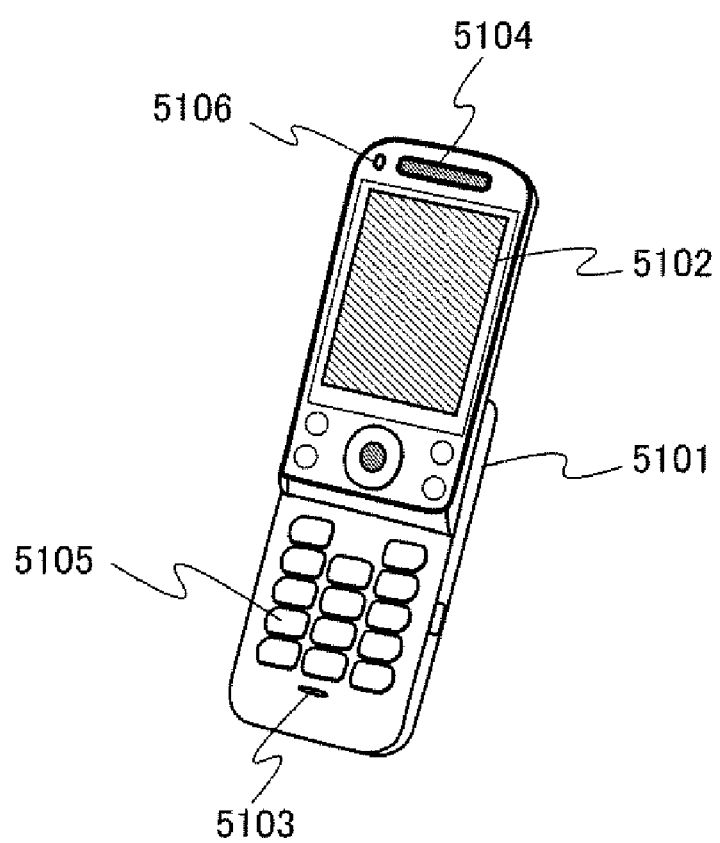

The features of the photoelectric conversion device in this embodiment include correcting a difference between a measured light intensity and an actual light intensity, which occurs when output current decreases due to the fact that strong light is received, and outputting the corrected current and obtaining an output current corresponding to the illuminance without degradation in dynamic range because correction is not performed when the illuminance is low. Accordingly, the electronic device including the photoelectric conversion device can achieve high accuracy and detect light in a dark place by adding the photoelectric conversion device as its component. The photoelectric conversion device can be used for display devices, laptop computers, or image reproducing devices provided with recording media (typically, devices which reproduce the content of recording media such as DVDs (digital versatile disc) and have displays for displaying the reproduced images). Further, the photoelectric conversion device can be used for electronic devices such as mobile phones, portable game machines, e-book readers, video cameras, digital still cameras, goggle-type displays (head mounted displays), navigation systems, and audio reproducing devices (e.g., car audio components and audio components). FIGS. 12A and 12B illustrate specific examples of these electronic devices.

FIG. 12A illustrates a display device including a housing 5001, a display portion 5002, a sensor portion 5003, and the like. The photoelectric conversion device can be used for the sensor portion 5003. The sensor portion 5003 detects the intensity of external light. The display device can control the luminance of the display portion 5002 in accordance with the intensity of detected external light. By controlling the luminance of the display portion 5002 in accordance with the intensity of external light, power consumption of the display device can be suppressed. Note that a display device includes all information display devices, for example, those for personal computers, for receiving television broadcast, and for displaying advertisement.

FIG. 12B illustrates a mobile phone including a main body 5101, a display portion 5102, an audio input portion 5103, an audio output portion 5104, operation keys 5105, a sensor portion 5106, and the like. The sensor portion 5106 detects the intensity of external light. The mobile phone can control the luminance of the display portion 5102 or the operation keys 5105 in accordance with the intensity of detected external light. By controlling the luminance of the display portion 5102 or the operation keys 5105 in accordance with the intensity of external light, power consumption of the mobile phone can be suppressed.

Note that what is illustrated in the drawing can be freely combined with or replaced with what is described in other embodiments as appropriate.

This application is based on Japanese Patent Application serial no. 2008-289408 filed with Japan Patent Office on Nov. 12, 2008, the entire contents of which are hereby incorporated by reference.

What is claimed is:

1. A photoelectric conversion device comprising:
a photoelectric conversion element;
a photocurrent output circuit configured to provide a first current corresponding to an amount of incident light on the photoelectric conversion element;
a photocurrent correcting circuit including a corrective photoelectric conversion element configured to provide a second current, the corrective photoelectric conversion element including a light shield film for shielding the corrective photoelectric conversion element from light wherein the light shield film has a transmittance a where a satisfies 0<a<1;
a photocurrent adder circuit configured to provide a fourth current; and
an amplifier circuit configured to amplify a current corresponding to the sum of the first current and the fourth current and to output the amplified current,
wherein the second current is 1/a times a photocurrent corresponding to the amount of incident light on the corrective photoelectric conversion element, and
wherein the fourth current is 1/(1−a) times a third current corresponding to a difference between the second current and the first current.

2. The photoelectric conversion device according to claim 1, wherein each of the photoelectric conversion element and the corrective photoelectric conversion element is photodiode.

3. The photoelectric conversion device according to claim 1, wherein each of a first diode element and a second diode element is PIN diode.

4. The photoelectric conversion device according to claim 1, wherein the light shield film which is a silicon film.

5. An electronic device including the photoelectric conversion device according to claim 1.

6. A photoelectric conversion device comprising:
a photoelectric conversion element;
a photocurrent output circuit configured to provide a first current corresponding to an amount of incident light on the photoelectric conversion element;
a photocurrent correcting circuit including a corrective photoelectric conversion element configured to provide a second current, the corrective photoelectric conversion element including a light shield film for blocking part of light;
a photocurrent adder circuit configured to provide a fourth current; and
an amplifier circuit configured to amplify a current corresponding to the sum of the first current and the fourth current and to output the amplified current,
wherein the second current is transformed from a photocurrent corresponding to the amount of incident light on the corrective photoelectric conversion element, and
wherein the fourth current is transformed from a third current corresponding to a difference between the second current and the first current.

7. The photoelectric conversion device according to claim 6, wherein each of the photoelectric conversion element and the corrective photoelectric conversion element is photodiode.

8. The photoelectric conversion device according to claim 6, wherein each of a first diode element and a second diode element is PIN diode.

9. The photoelectric conversion device according to claim 6, wherein the light shield film which is a silicon film.

10. An electronic device including the photoelectric conversion device according to claim 6.

11. A photoelectric conversion device comprising:
a photoelectric conversion element;
a photocurrent output circuit operationally connected to the photoelectric conversion element configured to provide a first current corresponding to an amount of incident light on the photoelectric conversion element;
a photocurrent correcting circuit including a corrective photoelectric conversion element configured to provide a second current, the corrective photoelectric conversion element including a light shield film for blocking part of light;
a photocurrent adder circuit operationally connected to the photocurrent output circuit and the photocurrent correcting circuit configured to provide a fourth current; and
an amplifier circuit operationally connected to the photocurrent output circuit and the photocurrent adder circuit configured to amplify a current corresponding to the sum of the first current and the fourth current and to output the amplified current.

12. The photoelectric conversion device according to claim 11, wherein each of the photoelectric conversion element and the corrective photoelectric conversion element is photodiode.

13. The photoelectric conversion device according to claim 11, wherein each of a first diode element and a second diode element is PIN diode.

14. The photoelectric conversion device according to claim 11, wherein the light shield film which is a silicon film.

15. An electronic device including the photoelectric conversion device according to claim 11.

16. The photoelectric conversion device according to claim 11, wherein the second current is transformed from a photocurrent corresponding to the amount of incident light on the corrective photoelectric conversion element.

17. The photoelectric conversion device according to claim 11, wherein the fourth current is transformed from a third current corresponding to a difference between the second current and the first current.

* * * * *